INVENTOR
Don J. Loughry
BY
Allan M. Lowe
ATTORNEY

INVENTOR
Don J. Loughry

BY Allan M. Lowe

ATTORNEY

INVENTOR
Don J. Loughry

BY Allan M. Lowe

ATTORNEY

United States Patent Office 3,388,340 Patented June 11, 1968

3,388,340

PHASE CONTROLLED RING OSCILLATOR COMPRISING A PLURALITY OF ACTIVE DELAY STAGES INDIVIDUALLY COUPLED TO A CONTROL DEVICE

Don J. Loughry, Cincinnati, Ohio, assignor to Avco Corporation, Cincinnati, Ohio, a corporation of Delaware Filed Dec. 29, 1965, Ser. No. 517,399
3 Claims. (Cl. 331—4)

ABSTRACT OF THE DISCLOSURE

This is a square wave ring oscillator comprising a cascaded odd-numbered plurality of individual phase-inverting transistor stages of the relaxation oscillator type. A feedback coupling renders co-phasal the square wave input and output. This ring oscillator is made to track a source of reference waves by the combination of a phase comparator and a control device. The output of the control device is applied individually to all of the delay stages. The relative delay times of the stages are maintained accurately with the same initial phase adjustment. Any error induced by a change in one delay element is averaged among all of the delay elements. An additional active variable delay element is interposed in the coupling between the output of the ring oscillator and an input of the phase comparator. The other input to the comparator is from a reference source. The control device also varies the delay time of this additional element.

The present invention relates generally to ring oscillators and more particularly to a multi-phase, square wave ring oscillator having a plurality of cascaded delay stages, each of which controls the occurrence times of the leading and trailing edges of its square wave output.

In digital computer and communication systems, it is frequently necessary to provide a multi-phase clock source capable of deriving square waves having precisely maintained phase relationships. In certain instances, the square waves are of a reference frequency while for other applications they must vary in frequency with a variable frequency source. Many of the prior art structures for deriving multi-phase clock pulses, such as lumped parameter delay lines, do not possess the capability of maintaining the phase precision required if the components thereof change value as a function of temperature and age. In addition, the prior art devices are typically not capable of providing precise multi-phase clock pulses, the frequency of which follow an input frequency.

According to the present invention, the foregoing objections to the prior art are overcome by utilizing a ring oscillator having a plurality of square wave deriving stages. The delays between the leading and trailing edges of the input and output of each individual stage are varied in response to a control signal indicative of the phase difference between a square wave generated by the oscillator and a reference frequency. Delays of the leading and trailing edges of the input and output of each stage are maintained equal to enable the ring oscillator to derive square waves, rather than rectangular waves.

The control system employed enables the present invention to maintain the ring oscillator frequency to within one percent of the frequency of a stable source, despite component variations in excess of twenty five percent. The control system also enables the ring oscillator to track an input source over a frequency range in excess of one octave. For example, the ring oscillator disclosed herein has actually followed an input signal from 5 mc. to in excess of 10 mc. while deriving a ten phase square wave output.

A further feature of the invention is that the ring oscillator frequency is swept through a range of values in response to the oscillator and reference frequencies becoming widely displaced or in response to the reference frequency being temporarily decoupled from the phase difference measuring circuit. The frequency sweep action of the oscillator minimizes the time required for hunting of the oscillator output to the reference frequency and enables stable frequency sweeping to be attained. Sweeping of the oscillator frequency is accomplished by varying the control signal applied to the delay element in response to the phase measuring circuit output dropping below a predetermined value.

Another aspect of the invention involves the particular variable delay element utilized. The variable delay circuit comprises, in essence, a pair of cascaded resistance capacitance charging circuits to which is applied the frequency control signal. The control signal varies the charging rates of the two circuits in a similar manner so that both charge with substantially the same slope in response to the leading and trailing edges of the square wave being delayed. Each charging circuit feeds a voltage level sensor that derives a bi-level output in response to its input being above and below a predetermined amplitude. To control the delay of both the leading and trailing square wave edges, a voltage inverter is coupled between the first and second resistance capacitance charging circuits.

The ring oscillator delay elements are isolated from each other, provide constant drive for the charging circuits, and are capable of high speed operation, i.e., handling square waves having frequencies in excess of ten megacycles, since each delay element includes an input network comprising a common base transistor coupled to a common emitter transistor.

Accordingly, some of the objects of the present invention are to provide a new and improved source of precisely controlled multi-phase square waves wherein: pulse repetition frequency and phase are maintained substantially constant despite wide variations in component values due, for example, to temperature changes and/or age; the pulse repetition frequency derived is capable of following wide variations of a frequency reference source; the pulse repetition frequency derived is controlled by a source of reference frequency which, if temporarily decoupled from the network, causes the oscillator to sweep through a range of frequencies and thereby enable the oscillator to lock on to the reference frequency once the reference frequency has been restored; a wide difference between the ring oscillation frequency and the frequency of a reference frequency source causes the oscillator to sweep through a range of frequencies and thereby enable the ring oscillator to lock on to the reference frequency, whereby stable frequency hunting is attained.

Other objects of the invention are to provide a new and improved square wave delay element for variably controlling the delay times of the leading and trailing edges applied thereto, wherein; maximum speed of operation is attained; a plurality of resistance capacitance timing circuits is provided, one for variably controlling the delay of the leading edge of the square wave input and another for variably controlling the delay of the square wave input trailing edge; isolation between the resistance capacitance timing circuits and the delay element input, together with constant drive for the timing circuits, and high speed operation are achieved with a simple, inexpensive input circuit.

The above and still further objects, features and advantages of the present invention will become apparent upon consideration of the following detailed description of one specific embodiment thereof, especially when taken in conjunction with the accompanying drawings, wherein.

Figure 1:
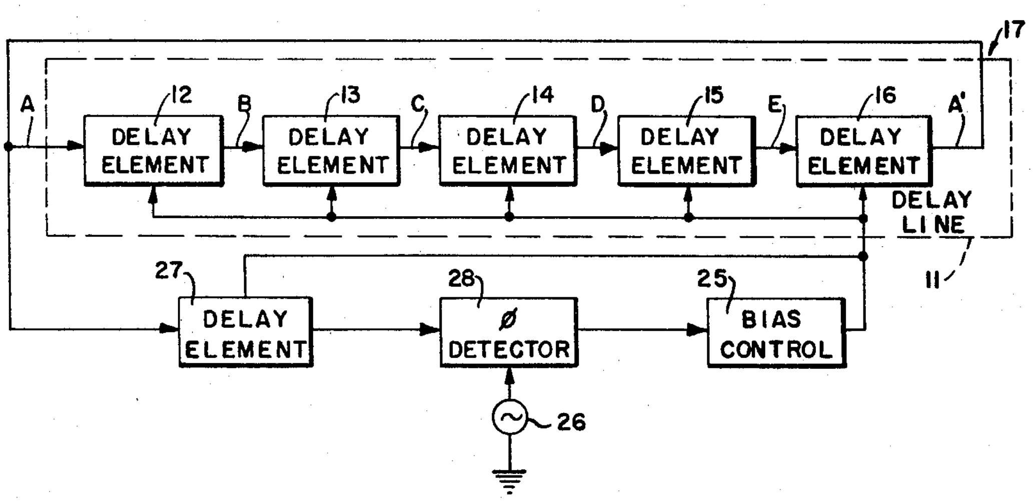
FIGURE 1 is a block diagram of a preferred embodiment of the present invention.

Reference is now made specifically to FIGURE 1 of the drawings wherein delay line 11 is illustrated as comprising five separate square wave delaying elements 12–16. Each of delay elements 12–16 derives a square wave output having its leading and trailing edges both delayed relative to the input. In addition, each of stages 12–16 inverts its input so that the outputs of the various stages are as illustrated in FIGURE 2.

Each of stages 12–16 is cascaded with the preceding stage and the output of stage 16 is coupled to the input of stage 12 to form a square wave multi-phase ring oscillator 17. Oscillator 17 is constructed so that the period of the square wave derived thereby is equal to the sum of the delays introduced by all of delay elements 12–16, i.e., the period of the square wave input to delay element 12 is equal to the sum of the delay times between the leading and trailing edges of the inputs and outputs of the five delay elements. Since the delays between the leading and trailing edges of the input and output of each of elements 16 are the same, square waves, rather than rectangular waves, are generated by oscillator 17.

Figure 2:
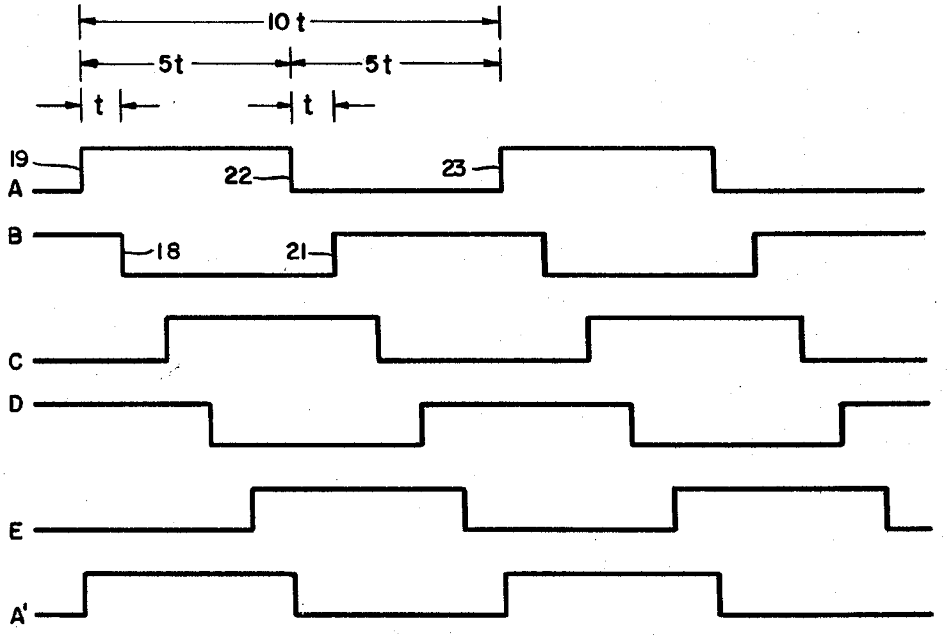
FIGURE 2 illustrates wave forms derived in the circuit of FIGURE 1.

The manner in which oscillator 17 functions can best be understood by reference to the wave forms illustrated in FIGURE 2. In FIGURE 2, the letters A, B, C, D, E, and A′ indicate the wave forms appearing at the correspondingly lettered leads in oscillator 17. Hence, the input to delay element 12 is the square wave indicated at A in FIGURE 2 while the output of delay element 12 has its leading negative going edge 18 delayed in time T seconds from the positive going leading edge 19 of wave form A. Similarly, the positive going trailing edge 21 of wave form B is delayed in time by T seconds from the negative going trailing edge 22 of wave form A. In a like manner, the square waves deriving from delay elements 13–16 are delayed by T seconds relative to their inputs.

Since five phase inverting delay stages or elements are provided, the sum of the delay times for the leading and training edges is 10T and the square wave generated by delay element 16, as indicated by wave form A′, has the same phase as the input to delay element 12. In consequence, a regenerative oscillating network is established by connecting the output of delay element 16 to the input of delay element 12. The square wave nature of the two segments comprising wave form A between leading edges 19 and 23 is to be noted, i.e., each of the segments has a duration of 5T.

The delay introduced on the leading and trailing edges of the square waves coupled through each of elements 12–16 is variably controlled in response to a D.C. voltage generated by bias control network 25. This network is also referred to as the control device or means. As the bias control network 25 output voltage increases and decreases, the relative delay introduced by each of elements 12–16 is decreased and increased, respectively.

The output voltage deriving from control network 25 is a function of the frequency difference between the outputs of square wave oscillator 17 and source 26. Source 26 may either be a constant frequency reference or a variable input frequency which oscillator 17 is designed to track. In one specific embodiment, actually constructed, it was found that oscillator 17 could track source 26 over a range in excess of one octave about a center frequency of 7.5 megacycles.

Control for network 25 involves coupling the output of oscillator 17 to delay element 27, which preferably has identical characteristics and similar components to each of the delay elements in delay line 11, except that it has no phase inversion properties. The utilization of delay element 27 between the output of oscillator 17 and the input of phase detector 28, that is also responsive to source 26, enables the phase detector to be isolated, with delay, from the oscillator. The delay isolation between the oscillator output and the phase detector 28 input enables derivation by bias control network 25 of a sawtooth voltage for sweeping the frequency of oscillator 17 over a wide range. Instantaneous response of phase detector 28 to bias control network 25 is not particularly desirable in the event of oscillator 17 becoming widely unsynchronized with source 26, as will be seen infra.

Delay element 27 is responsive to the output of bias control network 25 in a manner so that it introduces the the same delay as each of the elements in the delay line. Hence, delay element 27 provides the same compensation as each of the delay line elements in environments wherein component characteristics change appreciably.

In certain instances, delay element 27 need not possess the delay characteristics of the elements in delay line 11 but may merely be a non-phase inverting stage. In such an event, there is no connection between bias control network 25 and the isolating element.

Figure 3:
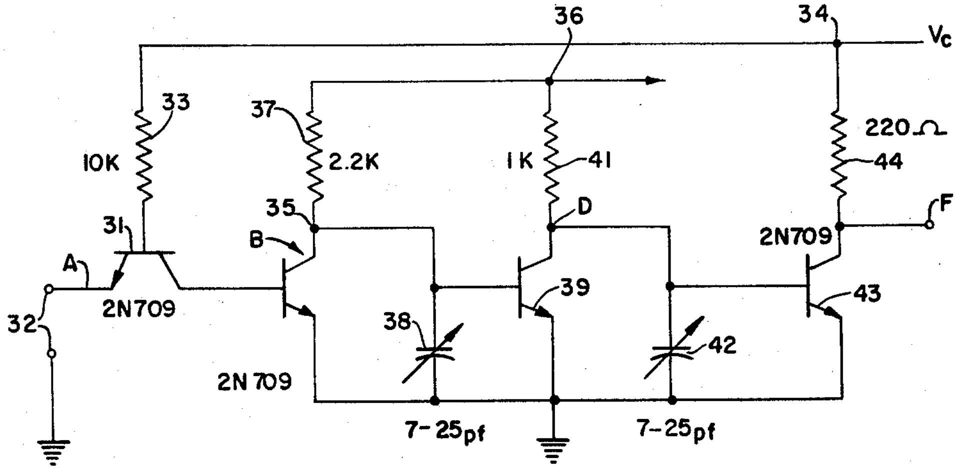
FIGURE 3 is one preferred embodiment of the delay element employed in FIGURE 1.

Reference is now made to FIGURE 3 of the drawings wherein there is illustrated a preferred embodiment of the circuit utilized for each of active variable delay elements 12–16 of FIGURE 1. The delay element of FIGURE 3 comprises NPN silicon transistor 31, connected in the common base mode, whereby its emitter is responsive to the square wave at terminals 32 and its base is connected through resistor 33 to the constant, positive D.C. bias voltage at terminal 34. The collector of transistor 31 is directly connected to the base of NPN silicon transistor 35, connected in the common emitter mode so that the emitter thereof is grounded and its collector is connected via resistor 37 to a positive D.C. voltage at terminal 36. The voltage at terminal 36 is a D.C. voltage corresponding with the output of bias control network 25, FIGURE 1.

Shunting the emitter collector path of transistor 35 is capacitor 38 to form, with resistor 37, a first RC charging circuit having its slope controlled by the amplitude of the D.C. voltage at terminal 36. The voltage across capacitor 38 is coupled to the base of NPN silicon transistor 39, connected as an inverter in the common emitter mode. Thereby, resistor 37, capacitor 38 and transistor 39 form a first timing network for delaying the negative going edge of the square wave applied to terminals 34.

The collector of transistor 39 is connected through resistor 41 through terminal 36 and is shunted by capacitor 42. A second RC timing circuit is thus provided and the components thereof are arranged so that its time constant is substantially the same as the time constant of the first RC timing circuit. The two RC charging circuits have the same time constant despite resistor 37 being greater in value than resistor 41, through adjustment of capacitors 38 and 42. Resistor 41 is smaller in value than resistor 37 in order to provide increased base drive for transistor 43 obtaining an overall delay element power gain.

The voltage across capacitor 42 is coupled to the base emitter junction of NPN silicon transistor 43, also connected in the common emitter mode. The collector of transistor 42 is connected through resistor 44 to the constant biasing voltage at terminal 34. Resistor 41, capacitor 42 and transistor 43 form a second timing circuit for delaying the positive going edge of the square wave feed to terminals 32.

Figure 4:
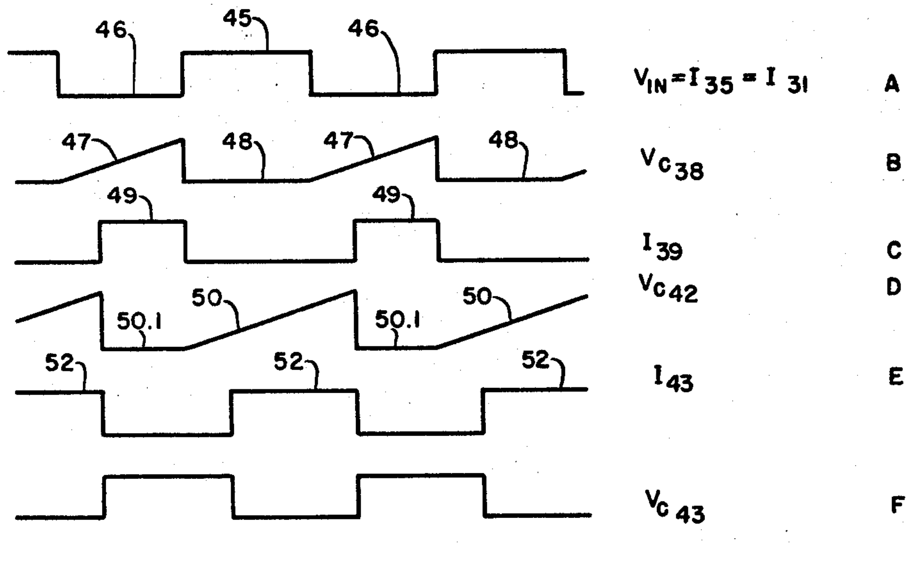
FIGURE 4 illustrates wave forms derived in the circuit of FIGURE 3.

The operation of the circuit illustrated by FIGURE 3 is best understood by reference to the wave forms of FIGURE 4. The square wave voltage applied to the delay element of FIGURE 3 at terminals 32 is illustrated by FIGURE 4A. Because transistor 31 is connected in the common base mode, its collector current is phase reversed relative to the input voltage at terminals 32. In consequence, less current is applied to the base of transistor 35 when the input voltage has a relatively smaller value as depicted by waveform segment 46. In a like manner a relatively large current is fed to the base of transistor 35 through the forward biased base collector diode of transistor 31, when the input voltage between terminals 32 is of a relatively high value as indicated by waveform segment 45. Thereby, the voltage at the collector of transistor 35 may be assumed to follow the phase inversion of the voltage at terminals 32 and is otherwise a very accurate replica thereof.

The combination of common base transistor 31 and common emitter transistor 35 isolate the timing circuit comprising resistor 37 and capacitor 38 from the driving impedance of the source connected between terminals 32. In addition, transistors 31 and 35 serve as a high speed amplifier, having a very short delay time, and enable the first RC charging circuit to be driven from a constant source impedance, the collector of transistor 35.

In response to the collector current transitions of transistor 35, the transistor collector impedance alternates between substantially open and closed circuit conditions. During the interval when the transistor 35 collector impedance is large, wave form segments 46 in FIGURE 4A, capacitor 38 charges through resistor 37 at a rate depending upon the D.C. voltage at terminal 36, as indicated by waveform segments 47, in FIGURE 4B. Capacitor 38 is quickly discharged through the emitter collector path of transistor 35 when transistor 35 is rendered into a low impedance conducting state, wave segments 45, so that sawtooth wave forms 47 are separated by constant, relatively low amplitude wave segments 48.

In response to the increasing wave segments 47 attaining a predetermined voltage, in the neighborhood of ¾ of a volt, the base emitter junction of transistor 39 becomes forward biased and the transistor emitter collector path is highly conductive, as illustrated by wave segments 49 in FIGURE 4C. Transistor 39 remains conducting until capacitor 38 is discharged through the collector emitter path of transistor 35, at which time the transistor 39 base emitter junction is back biased and its collector emitter path assumes a high impedance cut off state.

During the interval when transistor 39 is cut off, capacitor 42 is charged by the D.C. voltage at terminal 36 through resistor 41, as indicated by the sawtooth wave segments 50 of FIGURE 4D. In response to transistor 39 conducting, capacitor 42 is discharged through the emitter collector path thereof to establish the low voltage segments 50.1. In response to the charging voltage across capacitor 42 exceeding a predetermined threshold, about 0.75 volt, the base emitter junction of transistor 43 is forward biased, as indicated by wave segments 52, FIGURE 4E. The values of resistors 37, 41 and capacitors 38, 42 are selected so that the charging voltages across capacitors 38 and 42 forward bias transistors 39 and 43 at the same relative time periods with respect to the initiation of sawtooth voltages 47 and 50. Thereby, the leading and trailing edges of the input wave form, FIGURE 4A, are delayed by precisely the same period.

As indicated by FIGURE 4E, the current through the collector emitter path of transistor 43 comprises a series of square waves, in which the leading and trailing edges are in the same directions as the corresponding edges of the input wave, FIGURE 4A, but displaced therefrom. The voltage at the collector of transistor 43 is a square wave wherein the transitions are reversed in polarity relative to the input wave form, as well as delayed.

It is thus seen, that the circuit of FIGURE 3 basically involves delaying the leading edge of the input wave form, inverting the polarity of the delayed wave, and delaying the trailing edge of the delayed wave. Transistor 43, in addition to being a voltage sensor for deriving square wave outputs, provides sufficient amplification to drive a plurality of output elements. This drive, or fan out, is necessary in many instances because the following delay element must be driven, in addition to numerous load circuits.

Figure 5:
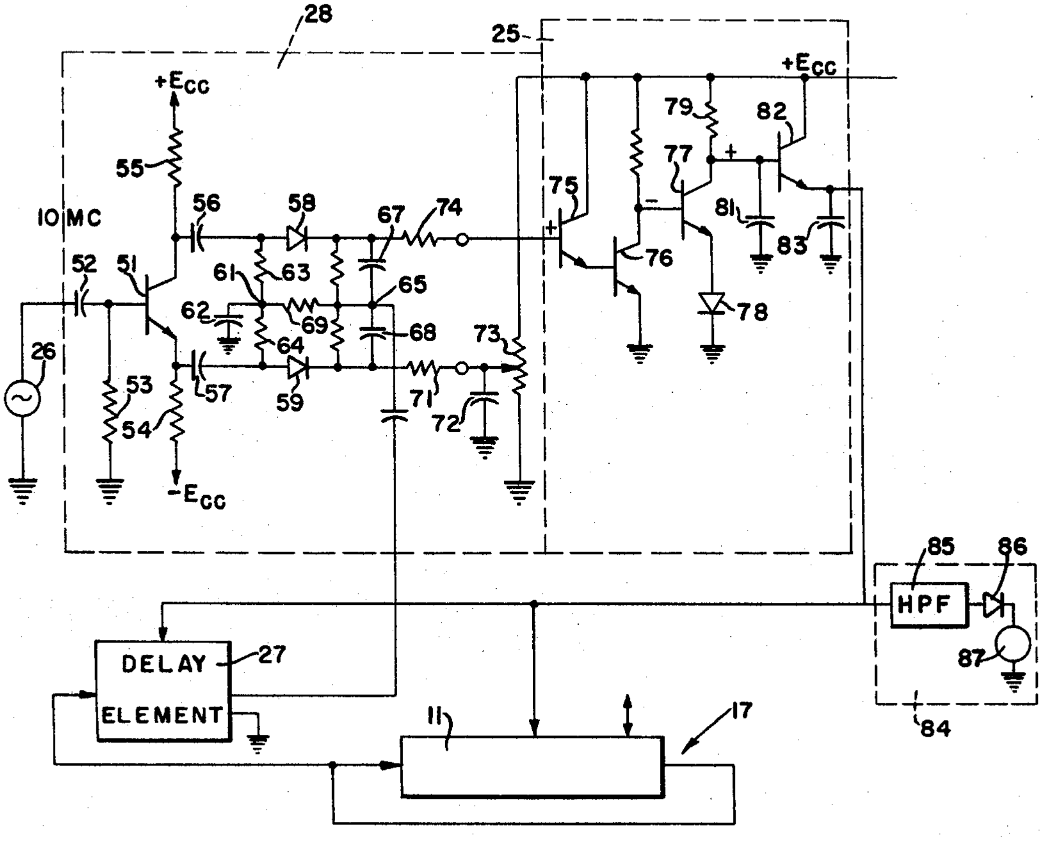
FIGURE 5 is a circuit diagram illustrating details of some of the components shown in FIGURE 1.

Reference is now made to FIGURE 5 of the drawings wherein details of the circuit of FIGURE 1 are illustrated. Phase detector 28 is of relatively conventional design wherein NPN transistor 51 serves as a phase splitter for signal source 26 that is coupled to its base via coupling capacitor 52. The base of transistor 51 is shunted to ground by biasing resistor 53 so that the transistor remains in a conducting state in the event of source 26 being decoupled from the network. The emitter and collector of transistor 51 are tied to positive and negative D.C. biasing sources via equal valued resistors 54 and 55, respectively. The emitter and collector voltages of transistor 51 are A.C. coupled via capacitors 56 and 57 to the anodes of diodes 58 and 59. The anodes of diodes 58 and 59 are connected to common point 61, that is A.C. coupled to ground via capacitor 62, through resistors 63 and 64. The cathodes of diodes 58 and 59 are connected to a further common terminal 65 through two parallel resistance capacitance networks 67 and 68. Terminals 61 and 65 are connected to each other by isolating resistor 69 so that the output of delay element 27 is effectively connected across resistor 69 for R.F. purposes.

The cathode of diode 59 is fed by a positive D.C. voltage via coupling resistor 71 and shunt filter capacitor 72, that is connected to the tap of potentiometer 73, connected across the constant D.C. voltage biasing the collector electrodes of phase detector 28 and bias control network 25. The setting of the potentiometer tap is adjusted to control the median frequency derived from ring oscillator 17. The voltage at the cathode of diode 58 is D.C. coupled via resistor 74 to the input terminal of bias control network 25.

Bias control network 25 comprises a four stage, D.C. transistor amplifier, of the non-inverting type. The first two stages of network 25 comprise NPN transistors 75 and 76, connected in the Darlington mode. The collector output of transistor 76 is directly coupled to the base of common emitter NPN transistor 77, the emitter of which is connected to the anode of diode 78 for bias stabilization purposes. The voltage at the collector of transistor 77, across resistor 79, is of the same relatively polarity as the input voltage to transistor 75. The collector of transistor 77 feeds shunt capacitor 81 and the base of NPN transistor 82. The emitter of common collector transistor 82 is connected to ground through storage capacitor 83, the voltage across which follows the base voltage of the transistor.

The output of bias control network 25, at the emitter of transistor 82, is connected to circuit 84 that provides an indication of when its input is changing at a rate in excess of a predetermined value. Indicator circuit 84 comprises high pass filter 85, connected to the output of network 25. High pass filter 85 is cascaded with detecting diode 86 which in turn drives indicator 87, which may be a lamp or buzzer.

Consideration will now be given to the manner in which the circuit of FIGURE 5 functions, assuming that source 26 has a constant, predetermined reference frequency. It is the object of the circuit of FIGURE 5, in such an event, to derive a multiplicity of phase displaced square waves having the same frequency as source 26. The number of phases is equal to the number of stages in delay line 11. The number of phases can be increased by a factor of two by connecting the outputs of the various delay elements 12–16 in line 11 to phase inverters.

Under stabilized operating conditions, the signal coupled to terminal 65 by delay element 27 is in quadrature phase relationship with the voltage of source 26. In such an event, the voltages developed across circuits 65 and 68 are equal but of opposite polarity. In consequence, the phase detector 28 output is zero and the voltage fed to bias control network 25 is equal to the voltage at the tap of potentiometer 73. In response to control network 25 having coupled thereto a voltage equal to the voltage at the tap of potentiometer 73, bias control network 25 derives a voltage that sets the delay of each of elements 12–16 at a value wherein $1/10T$, FIGURE 2, equals the frequency of source 26.

In the event that one of the delay elements 12–16 changes or if all of the delay elements change because of component value variations resulting from temperature or age, for example, there is a change in the frequency of the wave deriving from oscillator 17. In consequence, the orthogonal phase relationship between the output of delay element 27 and source 26 no longer prevails and detector 28 derives a voltage indicative of this difference. The voltage generated by phase detector 28 has an amplitude and polarity indicative of the frequency difference of its inputs. The net D.C. voltage across networks 67 and 68 is linearly or algebraically combined with the voltage at the tap of potentiometer 73. The resulting D.C. voltage is coupled through bias control network 25 to delay elements 12, 13, 14, 15, 16 and 27.

The magnitude of the bias control network 25 output is such that the charging rates of the networks including resistors 37 and 41 and capacitors 38 and 42, FIGURE 3, are varied to compensate for the changing component characteristics of the individual delay elements in ring oscillator 17. If each of the delay elements 12–16 changes similarly, or if only one of the delay elements changes, the delays of all of the elements are changed alike. In other words, if delay element 12 is the only one to change characteristics, the voltage deriving from bias control 25 is such that the delay of each of elements 12–16 is changed and the error that would have been introduced by element 12 is averaged amongst all of the elements. If each of elements 12–16 changes characteristics in the same manner, each is restored to its initial delay characteristic by the output of bias control circuit 25.

In the event of source 26 being decoupled from phase detector 28, the present invention provides for sweeping the frequency of oscillator 17 through a range of values to enable the oscillator to lock on to the frequency of source 26 when it is recoupled to the phase detector. In response to decoupling of source 26 from detector 28, the A.C. impedance from the anode of diode 58 to ground is greater than the A.C. impedance of diode 59 to ground. The lower impedance at the anode of diode 59 occurs because it is connected in the relatively low impedance emitter circuit of transistor 51 while diode 58 is connected in the relatively high impedance collector circuit of transistor 51. In consequence, more current flows from delay element 27 through network 68 and diode 59 than flows through circuit 67 and diode 58 during each negative half cycle of the delay element output. Greater negative voltage is thus developed across circuit 68 than is developed across circuit 67 and a net negative D.C. voltage appears across the series combination of these two circuits. Eventually, the negative voltage is equal approximately to the voltage at the tap of potentiometer 73 and the normal zero D.C. forward bias condition at the base of transistor 75 is removed whereby the transistor 75 is cut-off.

In response to transistor 75 cutting off, the base of transistor 77 is forward biased to provide a low impedance path for the charge established across capacitor 81. Capacitor 81 discharges at a rapid rate through transistor 77 to reduce the voltage on the base of transistor 82 to a level less than that required to maintain a forward bias condition. In response to back biasing of transistor 82, capacitor 83 is discharged through the RC timing networks of delay elements 12–16 and 27.

In response to the voltage across capacitor 83 dropping to a sufficiently low value, oscillator 17 ceases to operate and no voltage is applied by delay element 27 to terminal 65. In a relatively short time period after oscillator 17 stops operating, the net voltage across circuits 67 and 68 reduces substantially to zero and a positive voltage is again applied from the tap of potentiometer 73 to the base of transistor 75. The positive voltage at the base of transistor 75 is applied with inverted phase to the base of transistor 77. Transistor 77 is now driven to cut-off whereby capacitor 81 is recharged.

As the voltage across capacitor 81 increases, the voltage at the emitter of transistor 82 also increases, thereby raising the voltage at terminal 36 and re-establishing the delay properties of elements 12–16 in ring oscillator 17. As the delay properties of elements 12–16 are established, oscillator 17 commences operation at a relatively low frequency. As the voltage across capacitor 83 increases, the delay introduced by each of elements 12–16 becomes smaller so that the frequency of oscillator 17 is swept through an increasing range of values. When the frequencies of oscillator 17 and source 26, which has now been assumed to have been restored to the input of phase detector 28, are equal, the impedance of transistor 77 is stabilized and capacitor 81 ceases to charge. Thereby, the oscillation frequency of oscillator 17 is stabilized, as before.

It is to be understood that oscillator 17 may also be utilized to track the frequency of source 26 and thereby provide a multi-phase output having a frequency equal to that of the source. The manner in which the frequency of oscillator 17 is stabilized to equal the frequency of source 26 is substantially the same as described with regard to a stabilized reference source and an unstable ring oscillator having components that vary in value.

As indicated supra, the frequency of oscillator 17 is capable of tracking frequency variations of source 26 over a range of at least one octave. If the difference in frequency between oscillator 17 and source 26 should suddenly shift to a value that does not enable the control circuit to maintain the oscillator in synchronism with source 26, the oscillator frequency is swept through a range of values in a manner similar to that described for the situation when source 26 is decoupled from detector 28. When the two frequencies applied to phase detector 28 are widely separated, the square wave from delay element 27 is, on the average, coupled through diodes 58 and 59 without regard to the polarity of source 26. In other words, because of the extreme difference in frequency between the two detector inputs, the average current through diodes 58 and 59 is not dependent on the phase of the voltages at the emitter and collector of transistor 51. In consequence, phase detector 28 functions as if source 26 were decoupled from it.

To provide an indication of whether oscillator 17 is tracking source 26, high pass filter 85 derives an output only when the sawtooth is being generated by biasing network 25. Only in such event does the filter derive an A.C. voltage of sufficient magnitude to activate indicator 87. When oscillator 17 is stabilized or is changing frequency at a slow rate in response to slow variations in the output voltage of biasing control network 25, the high pass filter output is not sufficient magnitude to enable indicator 87 to be energized.

Figure 6:
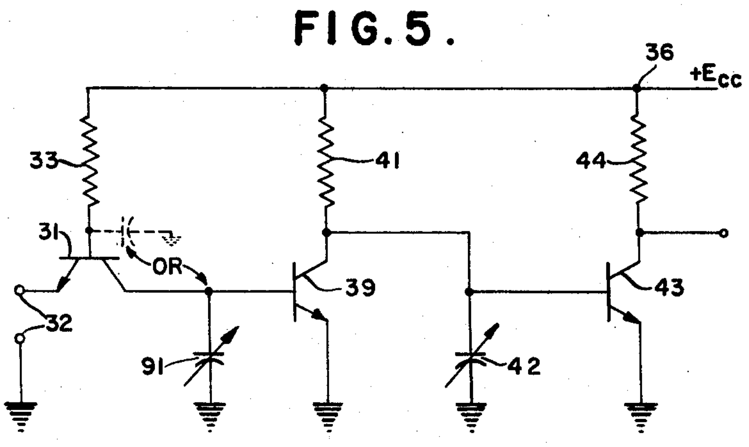
FIGURE 6 is a circuit diagram of a modification of the delay element illustrated in FIGURE 3.

Reference is now made to FIGURE 6 of the drawings wherein there is illustrated a modification of the basic delay element. The embodiment of FIGURE 6 is generally similar to that of FIGURE 3 except that only three transistor stages are provided in the former, and the bias voltage for each stage is derived in response to the variable D.C. bias control voltage deriving from network 25. The variable bias control voltage at terminal 36 is supplied to the collectors of transistors 39 and 43 and to the base of transistor 31. In the embodiment of FIGURE 6, the first resistance capacitance charging circuit comprises resistor 33 and capacitor 91, connected between the collector of common base transistor 31 and ground. In the alternative, capacitor 91 can be connected between the base of transistor 31 and ground.

Operation of the circuit in FIGURE 6 is substantially the same as that of the circuit illustrated in FIGURE 3 except that the rectangular wave at the collector of transistor 43 is of the same relative phase as the voltage applied to input terminals 32, i.e., a positive going wave at terminals 32 is followed by a positive going transition at the collector of transistor 43, rather than a negative going wave as with the circuit of FIGURE 3.

The degree of isolation with the circuit of FIGURE 6, as well as the amplification for the first resistance capacitance charging circuit, is not as great as with the arrangement of FIGURE 3. The circuit of FIGURE 6 does offer the advantage, though, of being capable of providing greater delay with the first RC charging circuit. The greater delay is achieved because the forward biasing of transistor 31 is responsive to the D.C. bias control voltage at terminal 36.

The delay elements of FIGURE 6 are connected in a ring arrangement, substantially as shown by FIGURE 1, except that a phase inversion network is required if a plurality of odd numbered stages is employed. The phase inversion stage is necessary to provide positive feedback to the input of each of the elements. The ring oscillator may also be modified, if the network of FIGURE 6 is employed, to include a plurality of even numbered delay elements, whereby positive feed back to the input of each element is automatically attained without the use of a phase inverter. Similarly, the phase inverting networks of FIGURE 1, may be arranged in a ring having an even number of stages if a single phase inverter is employed.

While I have described and illustrated one specific embodiment of my invention, and modifications of one subcombination element thereof, it will be clear that variations of the detail of construction which are specifically illustrated and described may be made without departing from the true spirit and scope of the invention as defined in the appended claims.

I claim:

1. The combination of:
a square wave ring oscillator comprising a cascaded plurality of individual phase-inverting active variable-delay elements constituting discrete stages and having a square wave output and a square wave input,
a feedback coupling between said output and input,
the sum of the delay times of said delay elements being so related to the period of the square wave oscillations as to maintain a co-phasal relation between said output and input,
a source of reference waves adapted to be tracked by said ring oscillator,
and means for causing the oscillations of said ring oscillator to track the reference waves in synchronous fashion comprising:
a phase comparator having a first input coupled to the output of said ring oscillator and a second input coupled to said source of reference wave forms,
said comparator also having an output,
control means coupled to the output of the comparator for deriving therefrom a control bias,
and means for applying said control bias individually to all of the delay stages so as to vary the several delay times thereof and the summation of the several discrete delays in order to maintain synchronism.

2. The combination of:
a square wave ring oscillator comprising a cascaded plurality of individual phase-inverting active variable-delay elements constituting discrete stages and having a square wave output and a square wave input,
a feedback coupling between said output and input,
the sum of the delay times of said delay elements being so related to the period of the square wave oscillations as to maintain a co-phasal relation between said output and input,
a source of reference waves adapted to be tracked by said ring oscillator,
and means for causing the oscillations of said ring oscillator to track the reference waves in synchronous fashion comprising:
a phase comparator having a first input coupled to the output of said ring oscillator and a second input coupled to said source of reference wave forms,
said comparator also having an output,
control means coupled to the output of the comparator for deriving therefrom a control bias,
an additional active variable delay element interposed in the coupling between the output of the ring oscillator and the first input of the phase comparator,
an inner-loop feedback compensating coupling between the output of the control means and the additional delay element,
and means for applying said control bias individually to all of the delay stages so as to vary the several delay times thereof and the summation of the several discrete delays in order to maintain synchronism.

3. The combination of:
a square wave ring oscillator comprising a cascaded plurality of individual phase-inverting active variable-delay elements constituting discrete stages and having a square wave output and a square wave input,
a feedback coupling between said output and input,
the sum of the delay times of said delay elements being so related to the period of the square wave oscillations as to maintain a co-phasal relation between said output and input,
a source of reference waves adapted to be tracked by said ring oscillator,
and means for causing the oscillations of said ring oscillator to track the reference waves in synchronous fashion comprising:
a phase comparator having a first input coupled to the output of said ring oscillator and a second input coupled to said source of reference wave forms,
said comparator also having an output,
control means coupled to the output of the comparator for deriving therefrom a control bias,
and means for applying said control bias individually to all of the delay stages so as to vary the several delay times thereof and the summation of the several discrete delays in order to maintain synchronism, the comparator comprising a phase splitter and a pair of unilateral devices so arranged that major deviation from synchronism tantamount to an interruption of the reference waves produces a predetermined voltage level at the output of the comparator, and means responsive to said level for varying the amplitude of the output of the control means to sweep the frequency of the ring oscillator through a range of values to restore synchronism.

References Cited

UNITED STATES PATENTS

| | | | |
|---|---|---|---|
| 3,047,817 | 7/1962 | Schneider | 331—57 |
| 3,121,846 | 2/1964 | Wormser | 331—57 X |
| 3,231,829 | 1/1966 | Reid | 331—20 |
| 3,247,465 | 4/1966 | Schucat | 331—4 |

ROY LAKE, *Primary Examiner.*

J. B. MULLINS, *Assistant Examiner.*